(12) United States Patent
Plesski et al.

(10) Patent No.: US 10,491,192 B1
(45) Date of Patent: Nov. 26, 2019

(54) TRANSVERSELY-EXCITED FILM BULK ACOUSTIC RESONATOR

(71) Applicant: Resonant Inc., Santa Barbara, CA (US)

(72) Inventors: Viktor Plesski, Gorgier (CH); Soumya Yandrapalli, Lausanne (CH); Robert B. Hammond, Santa Barbara, CA (US); Bryant Garcia, Burlingame, CA (US); Patrick Turner, San Bruno, CA (US); Jesson John, Dublin, CA (US); Ventsislav Yantchev, Sofia (BG)

(73) Assignee: Resonant Inc., Goleta, CA (US)

( * ) Notice: Subject to any disclaimer, the term of this patent is extended or adjusted under 35 U.S.C. 154(b) by 0 days.

(21) Appl. No.: 16/230,443

(22) Filed: Dec. 21, 2018

Related U.S. Application Data

(60) Provisional application No. 62/685,825, filed on Jun. 15, 2018, provisional application No. 62/701,363, (Continued)

(51) Int. Cl.
*H03H 9/02* (2006.01)
*H03H 9/13* (2006.01)
(Continued)

(52) U.S. Cl.
CPC ........ *H03H 9/568* (2013.01); *H03H 9/02015* (2013.01); *H03H 9/02031* (2013.01); (Continued)

(58) Field of Classification Search
CPC ............... H03H 3/02; H03H 2003/021; H03H 2003/027; H03H 9/02062; H03H 9/02157; H03H 9/02228; H03H 9/02559; H03H 2009/02503; H03H 9/13; H03H 2009/155; H03H 9/171; H03H 9/173; H03H 9/54;
(Continued)

(56) References Cited

U.S. PATENT DOCUMENTS

| | | | | |
|---|---|---|---|---|
| 5,726,610 A | * | 3/1998 | Allen | H03H 9/6423 310/313 B |
| 6,710,514 B2 | * | 3/2004 | Ikada | H03H 3/08 310/313 B |

(Continued)

FOREIGN PATENT DOCUMENTS

| WO | 2016017104 A1 | 2/2016 |
|---|---|---|
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 International Ultrasonics Symposium, Sep. 6-9, 2017. pp. 1-8.
(Continued)

*Primary Examiner* — Barbara Summons
(74) *Attorney, Agent, or Firm* — Socal IP Law Group LLP; John E. Gunther

(57) ABSTRACT

Acoustic resonator devices and filters are disclosed. An acoustic resonator includes a substrate and a piezoelectric plate having parallel front and back surfaces, the back surface attached to the substrate. An interdigital transducer (IDT) is formed on the front surface of the piezoelectric plate such that interleaved fingers of the IDT are disposed on a portion of the piezoelectric plate suspended over a cavity formed in the substrate.

36 Claims, 17 Drawing Sheets

Related U.S. Application Data filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018.

(51) Int. Cl.

| | | |
|---|---|---|
| *H03H 9/17* | (2006.01) | |
| *H03H 9/56* | (2006.01) | |
| *H03H 3/02* | (2006.01) | |
| *H01L 41/047* | (2006.01) | |

(52) U.S. Cl.
CPC .... *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H01L 41/0477* (2013.01); *H03H 3/02* (2013.01); *H03H 9/02039* (2013.01); *H03H 2003/023* (2013.01)

(58) Field of Classification Search
CPC ........ H03H 9/562; H03H 9/564; H03H 9/568; H03H 9/02031; H03H 9/132; H03H 9/174; H03H 9/176; H03H 9/02015; H03H 9/02039; H03H 2003/023; H01L 41/0477
USPC ................................ 333/186, 187, 189, 193
See application file for complete search history.

(56) References Cited

U.S. PATENT DOCUMENTS

| | | | | |
|---|---|---|---|---|
| 7,535,152 | B2 | 5/2009 | Ogami et al. | |
| 9,425,765 | B2* | 8/2016 | Rinaldi | G01J 5/046 |
| 9,525,398 | B1* | 12/2016 | Olsson | H03H 3/02 |
| 9,748,923 | B2* | 8/2017 | Kando | H03H 3/02 |
| 10,284,176 | B1* | 5/2019 | Solal | G10K 11/18 |
| 2011/0109196 | A1* | 5/2011 | Goto | H03H 9/02559 |
| | | | | 310/313 C |
| 2013/0234805 | A1* | 9/2013 | Takahashi | H03H 9/02228 |
| | | | | 333/133 |
| 2014/0145556 | A1* | 5/2014 | Kadota | H03H 9/02228 |
| | | | | 310/313 A |
| 2014/0151151 | A1* | 6/2014 | Reinhardt | H03H 3/02 |
| | | | | 181/294 |
| 2015/0333730 | A1* | 11/2015 | Meltaus | H03H 9/02228 |
| | | | | 310/321 |
| 2017/0179928 | A1 | 6/2017 | Raihn et al. | |
| 2017/0214387 | A1 | 7/2017 | Burak et al. | |
| 2019/0068164 | A1 | 2/2019 | Houlden et al. | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yang, A. Gao et al. "5 Ghz Lithium Niobate Mems Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/2019/036433. dated Aug. 29, 2019.

* cited by examiner

TRANSVERSELY-EXCITED FILM BULK ACOUSTIC RESONATOR

RELATED APPLICATION INFORMATION

This patent claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
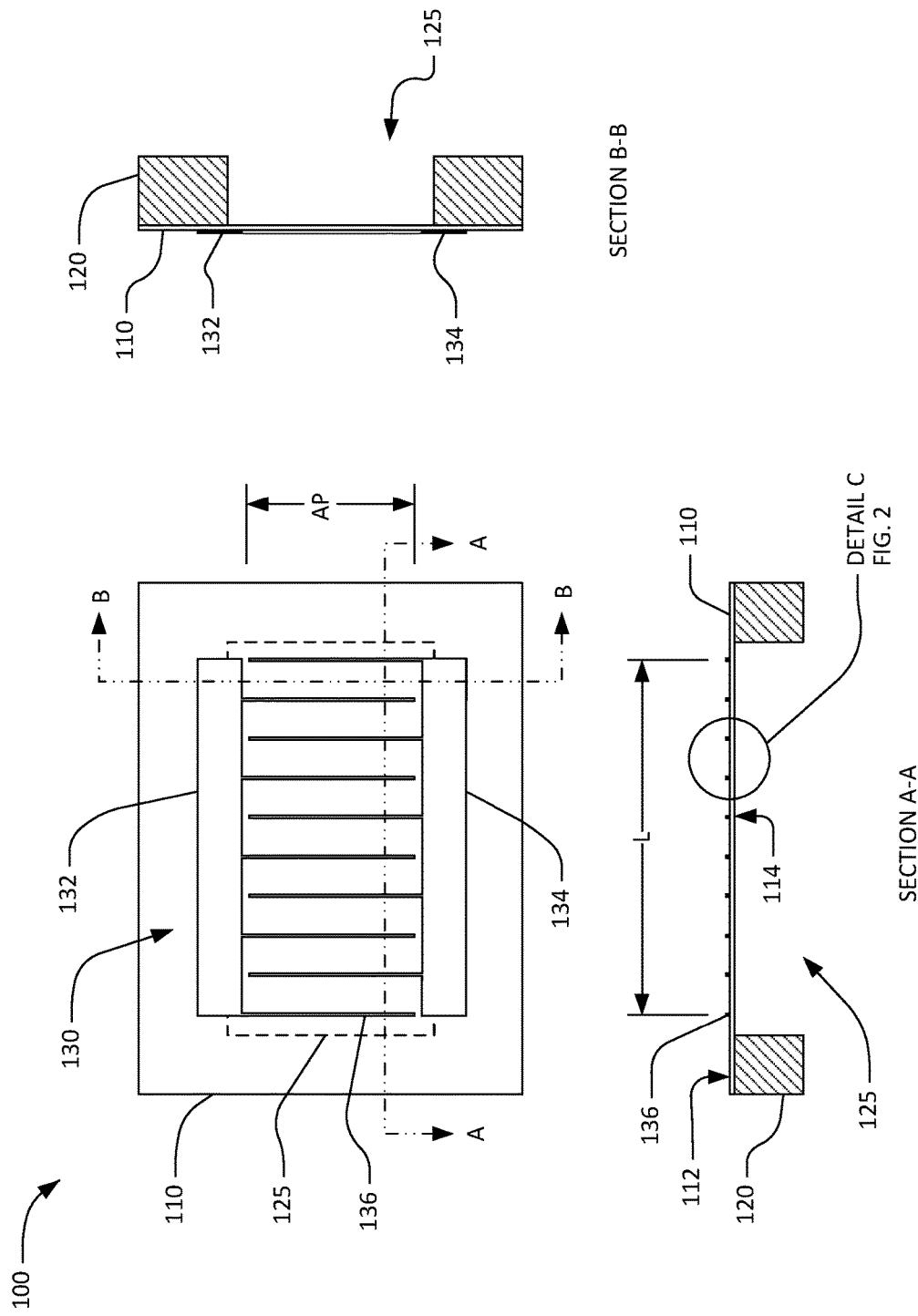
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate, or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 125 is formed in the substrate 120 such that the portion of the piezoelectric plate 110 containing the IDT 130 is suspended over the cavity 125 without contacting the substrate 120. "Cavity" has its conventional meaning of "an empty space within a solid body." The cavity 125 may be a hole completely through the substrate 120 (as shown in Section A-A and Section B-B) or a recess in the substrate 120. The cavity 125 may be formed, for example, by selective etching of the substrate 120 before or after the piezoelectric plate 110 and the substrate 120 are attached. As shown in FIG. 1, the cavity 125 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
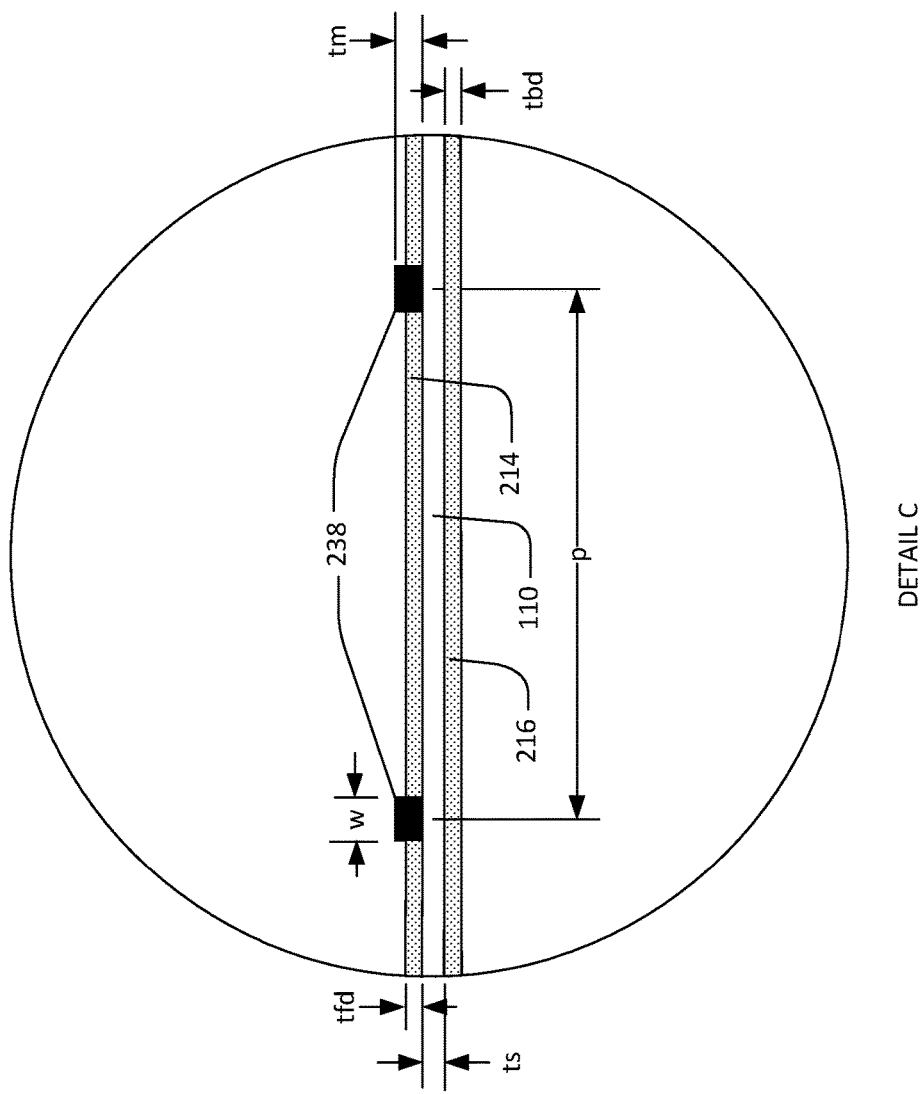
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
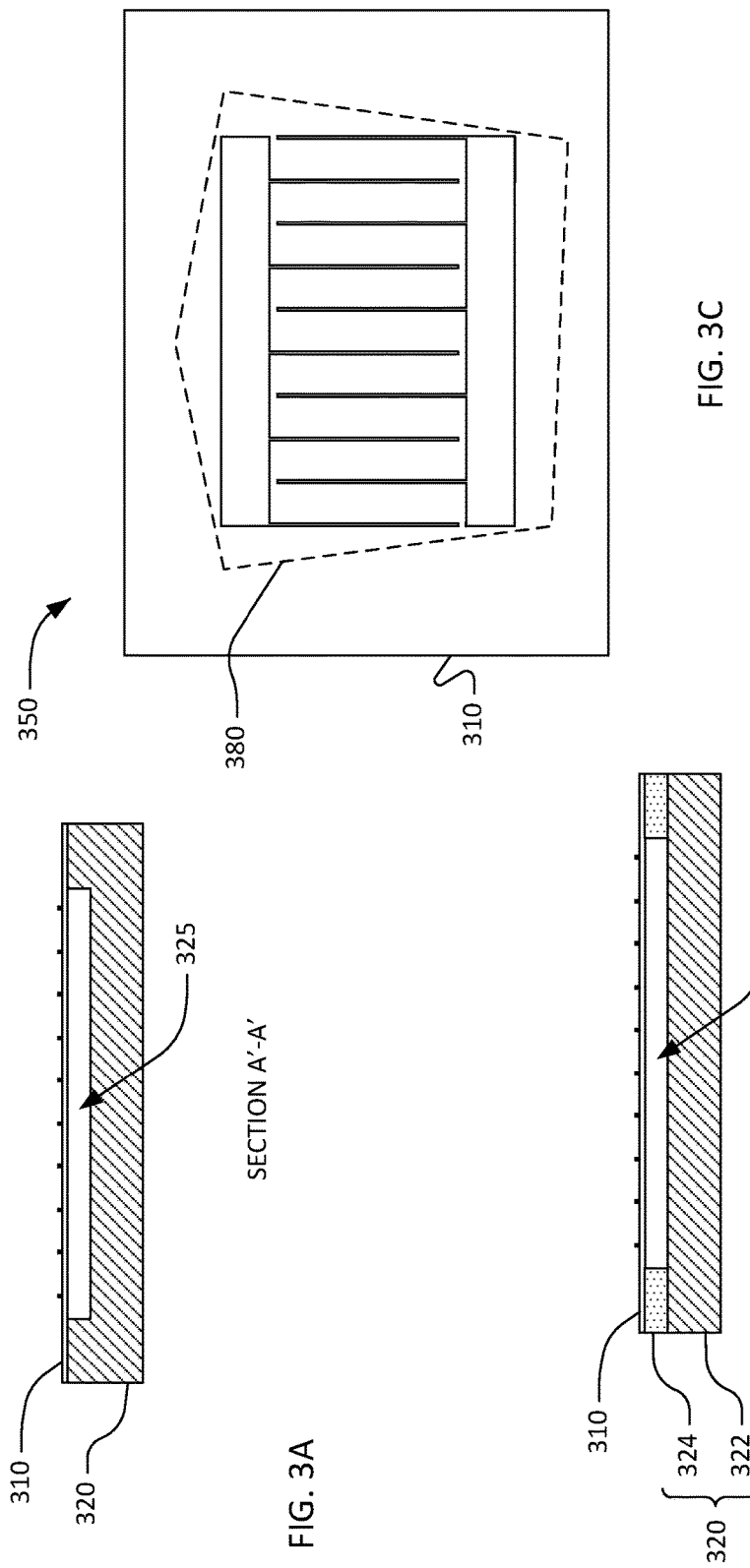
FIG. 3A is an alternative schematic cross-sectional view of the XBAR of FIG. 1.
FIG. 3B is another alternative schematic cross-sectional view of the XBAR of FIG. 1.
FIG. 3C is an alternative schematic plan view of an XBAR

FIG. 3A and FIG. 3B show two alternative cross-sectional views along the section plane A-A defined in FIG. 1. In FIG. 3A, a piezoelectric plate 310 is attached to a substrate 320. A cavity 325, which does not fully penetrate the substrate 320, is formed in the substrate under the portion of the piezoelectric plate 310 containing the IDT of an XBAR. The cavity 325 may be formed, for example, by etching the substrate 320 before attaching the piezoelectric plate 310. Alternatively, the cavity 325 may be formed by etching the substrate 320 with a selective etchant that reaches the substrate through one or more openings provided in the piezoelectric plate 310.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A cavity 325 is formed in the intermediate layer 324 under the portion of the piezoelectric plate 310 containing the IDT of an XBAR. The cavity 325 may be formed, for example, by etching the intermediate layer 324 before attaching the piezoelectric plate 310. Alternatively, the cavity 325 may be formed by etching the intermediate layer 324 with a selective etchant that reaches the substrate through one or more openings provided in the piezoelectric plate 310.

FIG. 3C is a schematic plan view of another XBAR 350. The XBAR 350 includes an IDT formed on a piezoelectric plate 310. The piezoelectric plate 310 is disposed over a cavity 380 in a substrate. In this example, the cavity 380 has an irregular polygon shape such that none of the edges of the cavity are parallel, nor are they parallel to the conductors of the IDT. A cavity may have a different shape with straight or curved edges.

Figure 4:
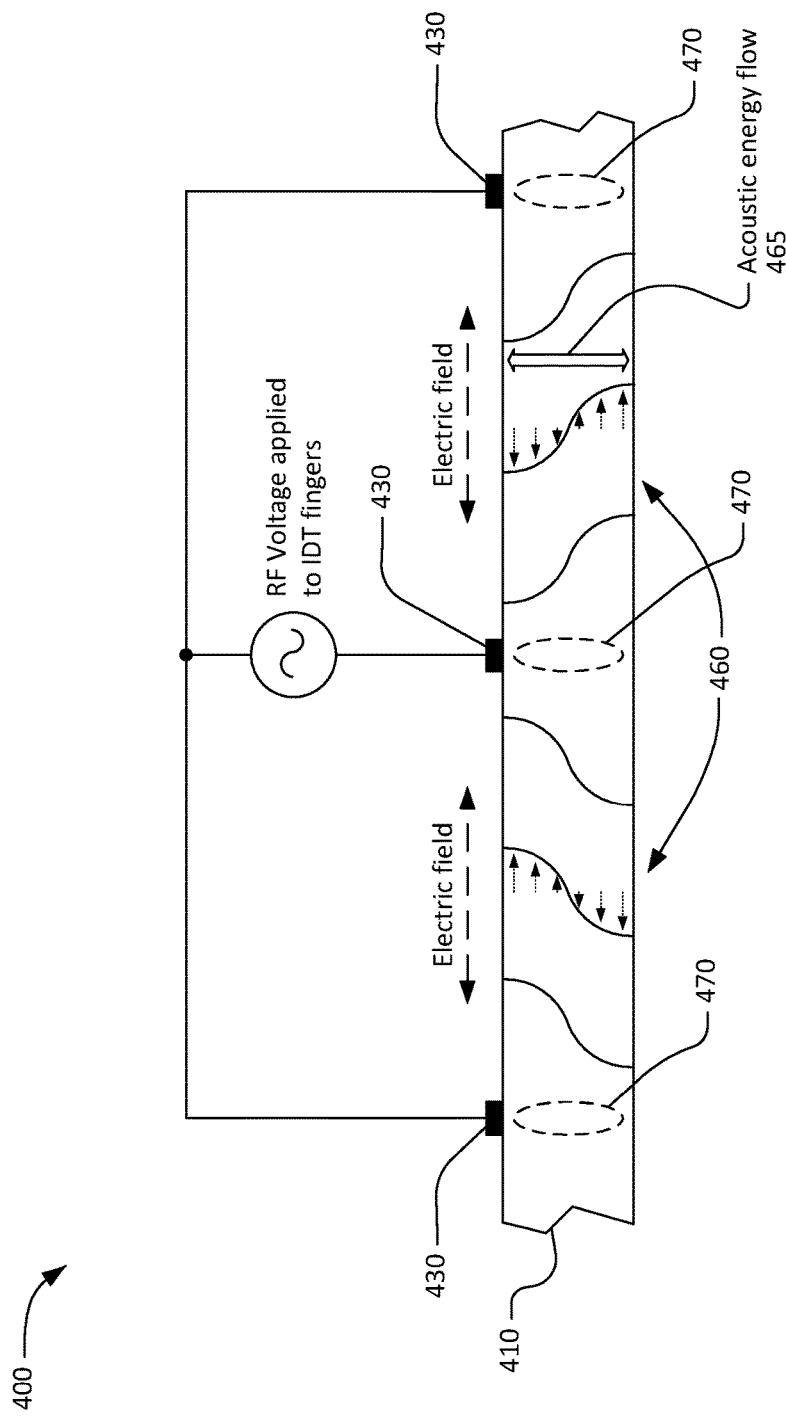
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited shear acoustic waves is predominantly vertical, normal to the surface of the piezoelectric plate, as indicated by the arrow 465.

Considering FIG. 4, there is essentially no electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus high piezoelectric coupling enables the design and implementation of microwave and millimeter-wave filters with appreciable bandwidth.

Figure 5:
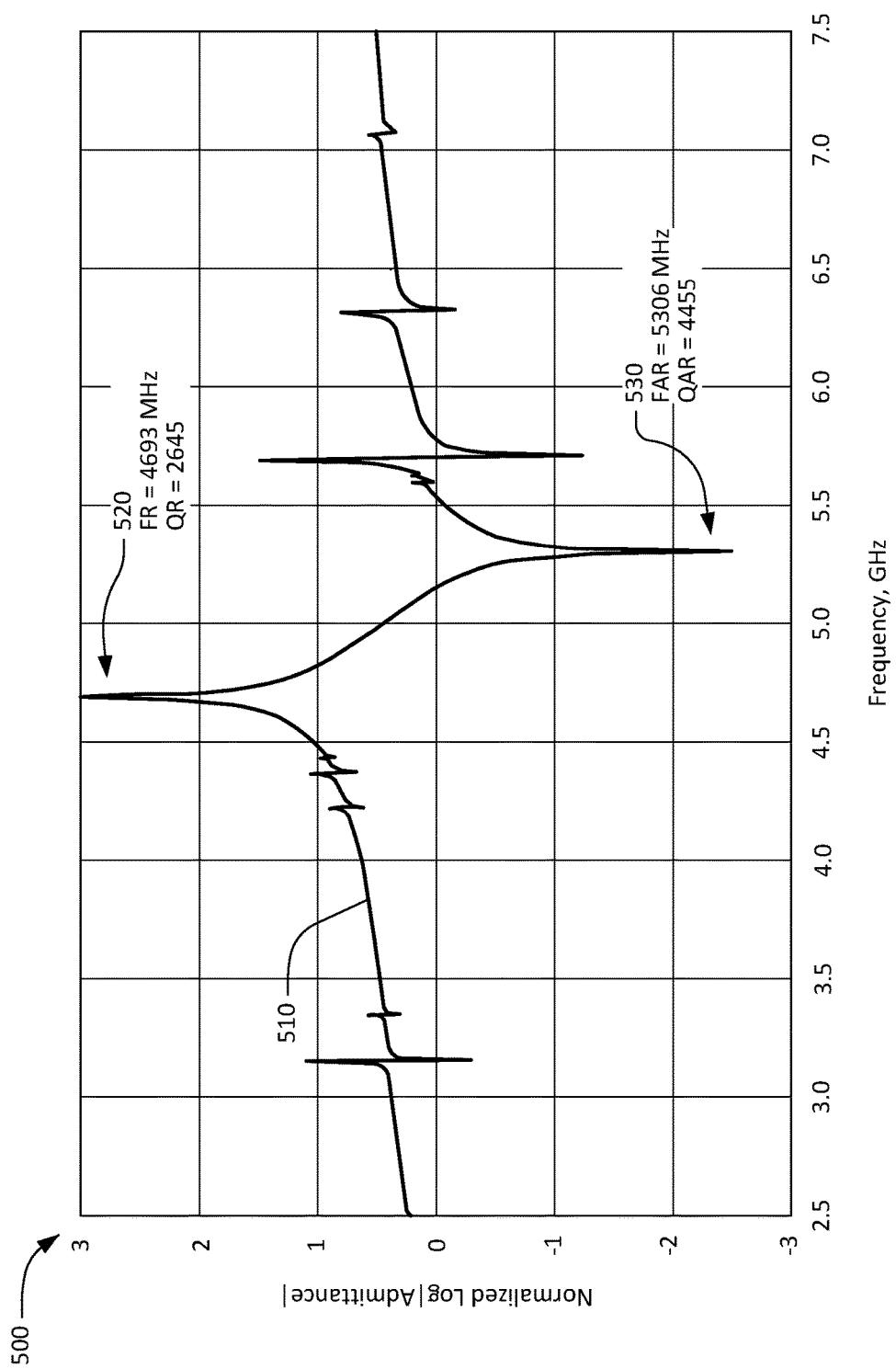
FIG. 5 is a chart of the admittance of a simulated XBAR.

FIG. 5 is a chart 500 with a plot 510 of the normalized magnitude of the admittance (on a logarithmic scale) as a function of frequency of an XBAR simulated using finite element method (FEM) simulation techniques. In the simulated XBAR, the piezoelectric plate is Z-cut (i.e. Z axis normal to the plate) lithium niobate. The IDT fingers are aluminum. The IDT is oriented such that the y-axis of the piezoelectric plate is normal to the IDT fingers. The substrate supporting the piezoelectric plate is silicon with a cavity formed completely through the silicon (as shown in FIG. 1). Losses in the piezoelectric plate and IDT fingers were simulated using standard material parameters. The simulated physical dimensions are as follows: is =400 nm; tfd=0; tbd=0; tm=100 nm; p=5 um; w=500 nm. The admittance is normalized for a single pair of IDT fingers and an aperture of 1 meter. The admittance of an XBAR with N IDT fingers and an aperture A (in m) can be estimated by multiplying the normalized admittance provided in FIG. 5 by (N−1)·A.

The simulated XBAR exhibits a resonance at a frequency FR of 4693 MHz and an anti-resonance at a frequency FAR of 5306 MHz. The Q at resonance QR is 2645 and the Q at anti-resonance QAR is 4455. The absolute difference between FAR and FR is about 600 MHz, and the fractional difference is about 0.12. The acoustic coupling can be roughly estimated to the 24%. Secondary resonances are evident in the admittance curve at frequencies below FR and above FAR.

Acoustic RF filters usually incorporate multiple acoustic resonators. Typically, these resonators have at least two different resonance frequencies. For example, an RF filter using the well-known "ladder" filter architecture includes shunt resonators and series resonators. A shunt resonator typically has a resonance frequency below the passband of the filter and an anti-resonance frequency within the passband. A series resonator typically has a resonance frequency within the pass band and an anti-resonance frequency above the passband. In many filters, each resonator has a unique resonance frequency. An ability to obtain different resonance frequencies for XBARs made on the same piezoelectric plate greatly simplifies the design and fabrication of RF filters using XBARs.

Figure 6:
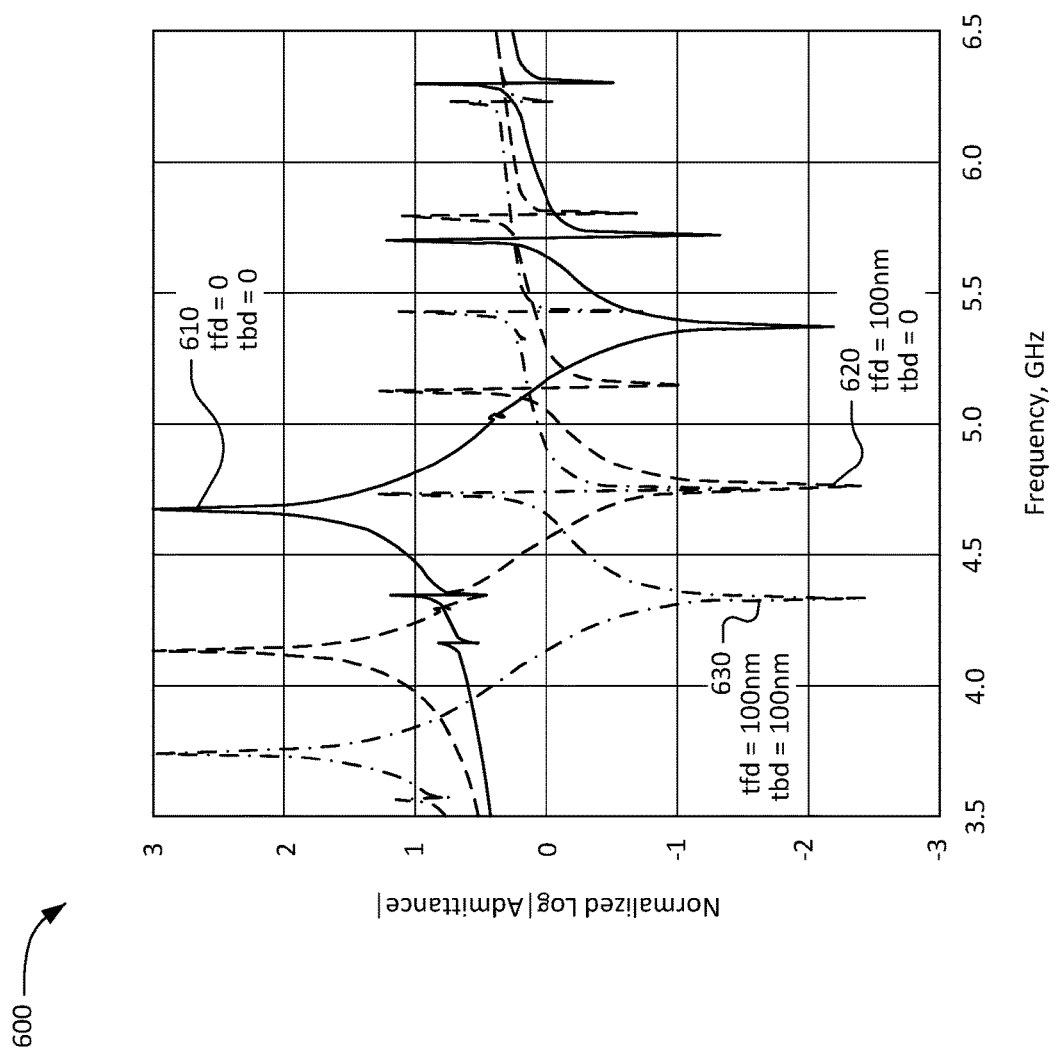
FIG. 6 is a chart comparing the admittances of three simulated XBARs with different dielectric layers.

FIG. 6 is a graph 600 comparing the normalized admittances, as functions of frequency, of three XBARs with different dielectric layers. The admittance data results from two-dimensional simulation of a XBAR structure using the same materials and dimensions (except for the dielectric layers) as the previous example. The admittance is normalized for a single pair of IDT fingers and an aperture of 1 m. The solid line 610 is a plot of the normalized admittance per unit aperture for an XBAR with tfd=tbd=0 (i.e. an XBAR without dielectric layers). The normalized admittance of this XBAR is comparable to the normalized admittance plot in FIG. 5, with slight differences due to the different simulation methodologies. The dashed line 620 is a plot of the normalized admittance for an XBAR with 100 nm of SiO2 on the front surface of the piezoelectric slab between the IDT fingers (tfd=100 nm and tbd=0). The addition of the SiO2 layer on the front surface of the piezoelectric plate shifts the resonance frequency down by about 500 MHz, or about 11%, compared to the XBAR with no dielectric layers. The dash-dot line 630 is a plot of the normalized admittance for an XBAR with 100 nm of SiO2 over the front surface of the piezoelectric slab between the IDT fingers and 100 nm of SiO2 on the back surface of the piezoelectric slab (tfd=tbd=100 nm). The addition of the SiO2 layers on both surfaces of the piezoelectric plate shifts the resonance frequency down by about 900 MHz, or 20%, compared to the XBAR with no dielectric layers.

Figure 7:
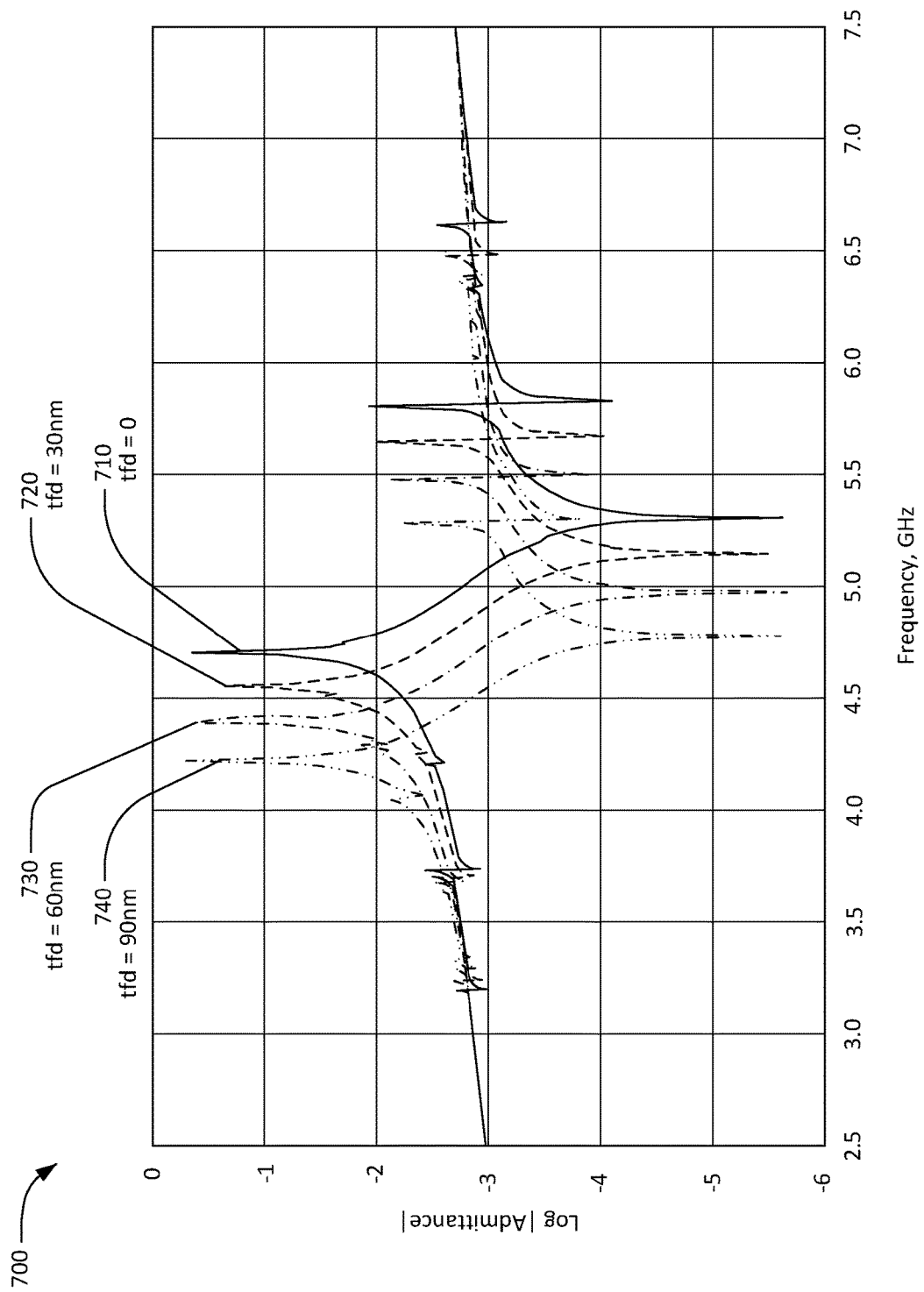
FIG. 7 is a chart comparing the admittances of four simulated XBARs with different dielectric layer thicknesses.

FIG. 7 is a graph 700 comparing the admittances, as functions of frequency, of four XBARs with different front-side dielectric layer thicknesses. The admittance data results from three-dimensional simulation of XBARs with the following parameter: is =400 nm; tfd=0, 30, 60, 90 nm; tbd=0; tm=100 nm; p=4.2 um; w=500 nm; AP=20 um; and N (total number of IDT fingers)=51. The substrate is Z-cut lithium niobate, the IDT conductors are aluminum, and the dielectric layers are SiO2.

The solid line 710 is a plot of the admittance of an XBAR with tfd=0 (i.e. an XBAR without dielectric layers). The dashed line 720 is a plot of the admittance of an XBAR with tfd=30 nm. The addition of the 30 nm dielectric layer reduces the resonant frequency by about 145 MHz compared to the XBAR without dielectric layers. The dash-dot line 730 is a plot of the admittance of an XBAR with tfd=60 nm. The addition of the 60 nm dielectric layer reduces the resonant frequency by about 305 MHz compared to the XBAR without dielectric layers. The dash-dot-dot line 740 is a plot of the admittance of an XBAR with tfd=90 nm. The addition of the 90 nm dielectric layer reduces the resonant frequency by about 475 MHz compared to the XBAR without dielectric layers. The frequency and magnitude of the secondary resonances are affected differently than the primary shear-mode resonance.

Importantly, the presence of the dielectric layers of various thicknesses has little or no effect on the piezoelectric coupling, as evidenced by the nearly constant frequency offset between the resonance and anti-resonance of each XBAR.

Figure 8:
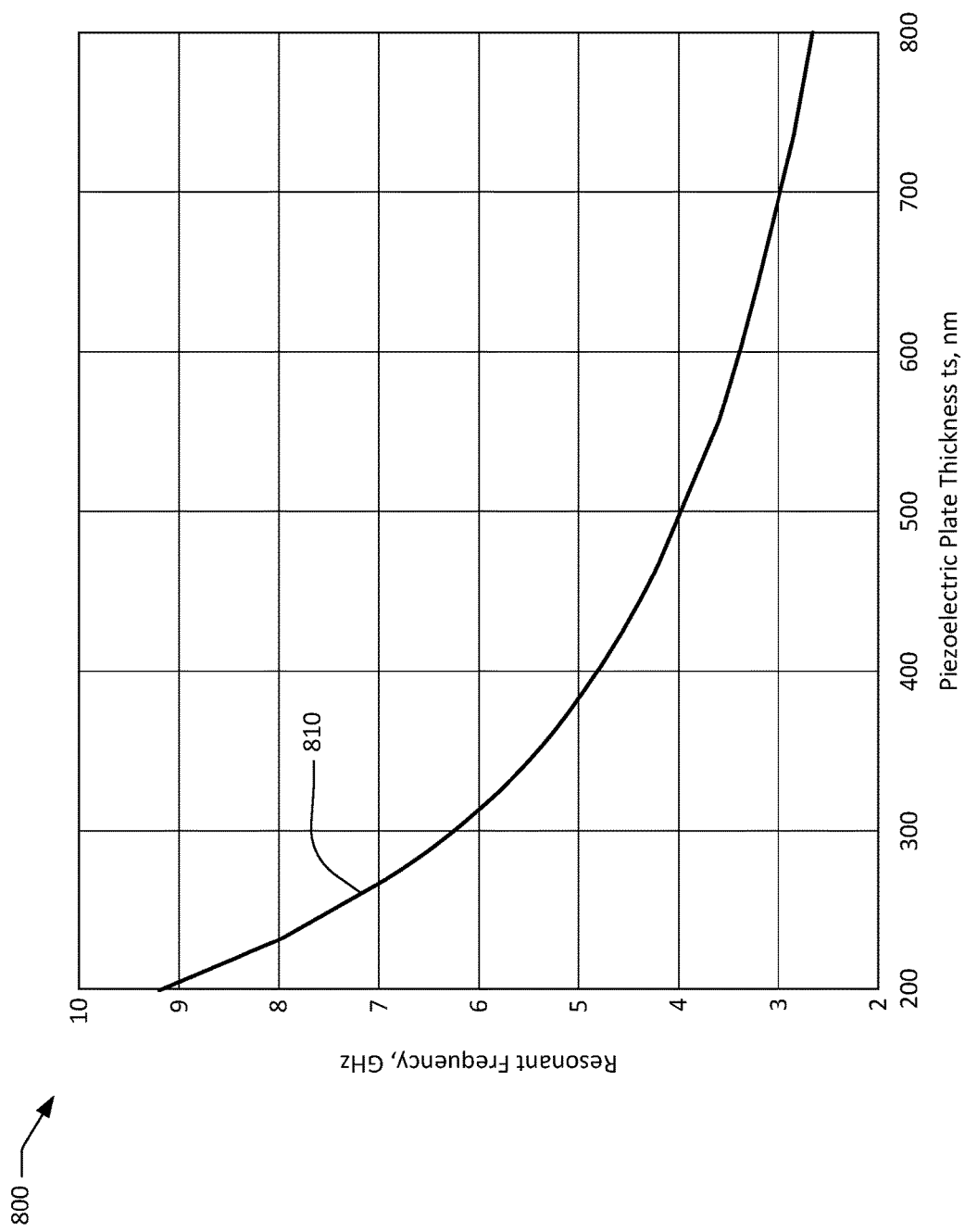
FIG. 8 is a plot showing the effect of piezoelectric plate thickness on resonance frequency of an XBAR.
Figure 9:
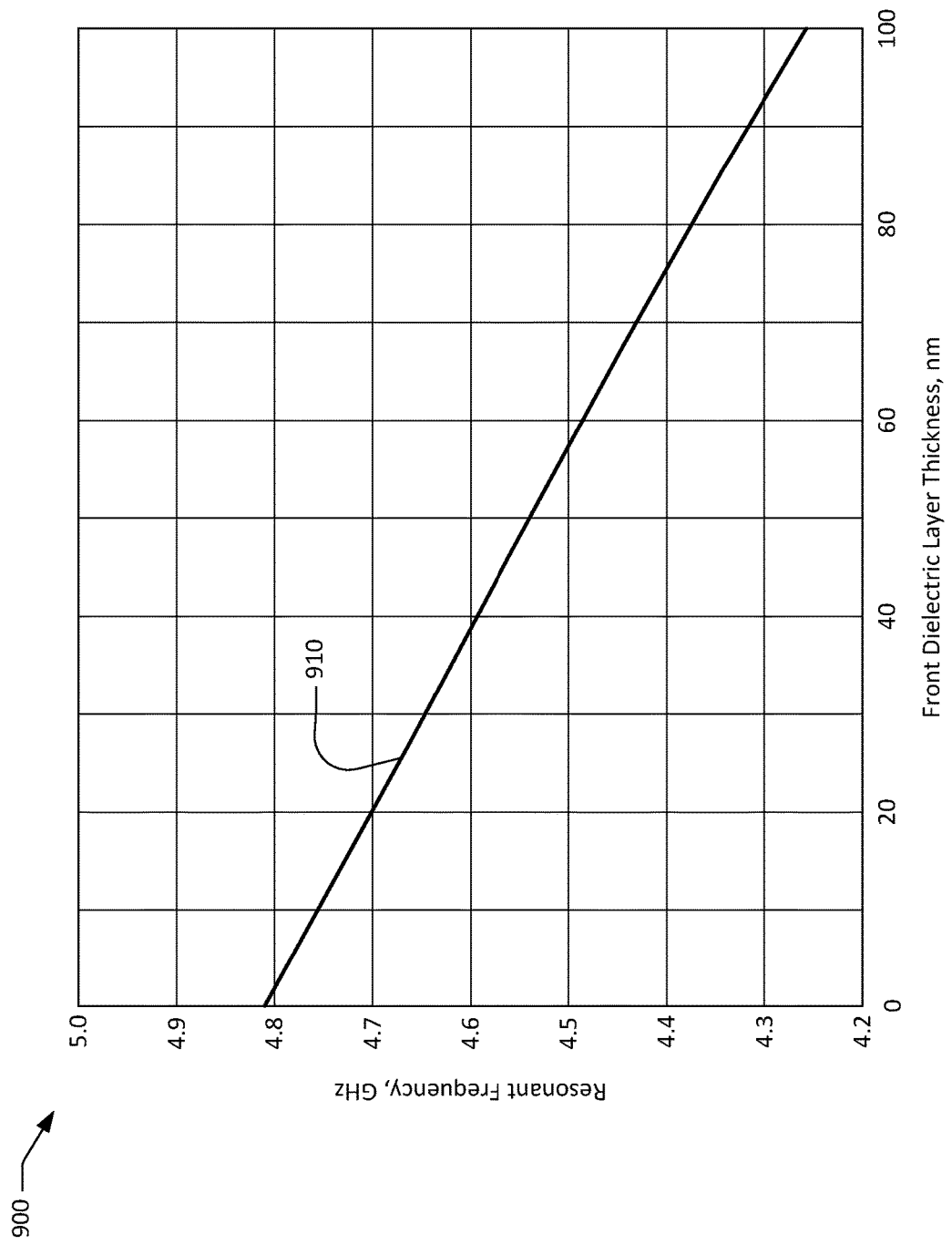
FIG. 9 is a plot showing the effect of front dielectric layer thickness on resonance frequency of an XBAR.
Figure 10:
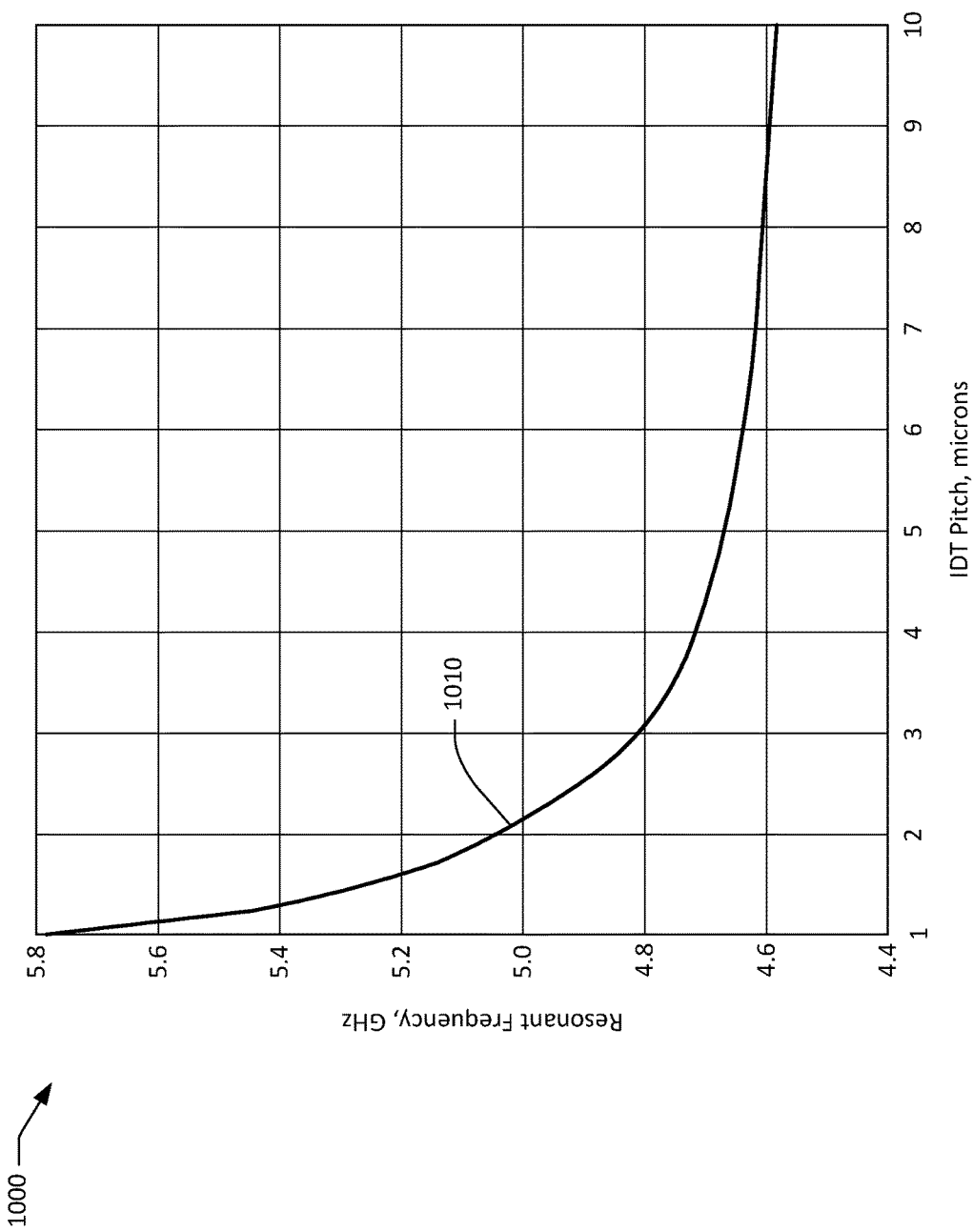
FIG. 10 is a plot showing the effect of IDT finger pitch on resonance frequency of an XBAR.

FIG. 8, FIG. 9, and FIG. 10 are graphs showing the dependence, determined by simulation, of resonant frequency on XBAR physical characteristics. Specifically, FIG. 8 is a graph of resonant frequency as a function of piezoelectric plate thickness ts with IDT finger pitch p=3 microns and no front-side or back-side dielectric layer (tfd=tbd=0). FIG. 9 is a graph of resonant frequency as a function of front-side dielectric layer thickness tfd for piezoelectric plate thickness ts=400 nm and IDT finger pitch p=3 microns. FIG. 10 is a graph of resonant frequency as a function of IDT finger pitch p with piezoelectric plate thickness ts=400 nm and tfd=tbd=0. In all cases, the piezoelectric substrate is Z-cut lithium niobate and the IDT fingers were aluminum with a width w=500 nm and thickness tm=100 nm. The front-side dielectric layer, when present, is SiO2.

Figure 11:
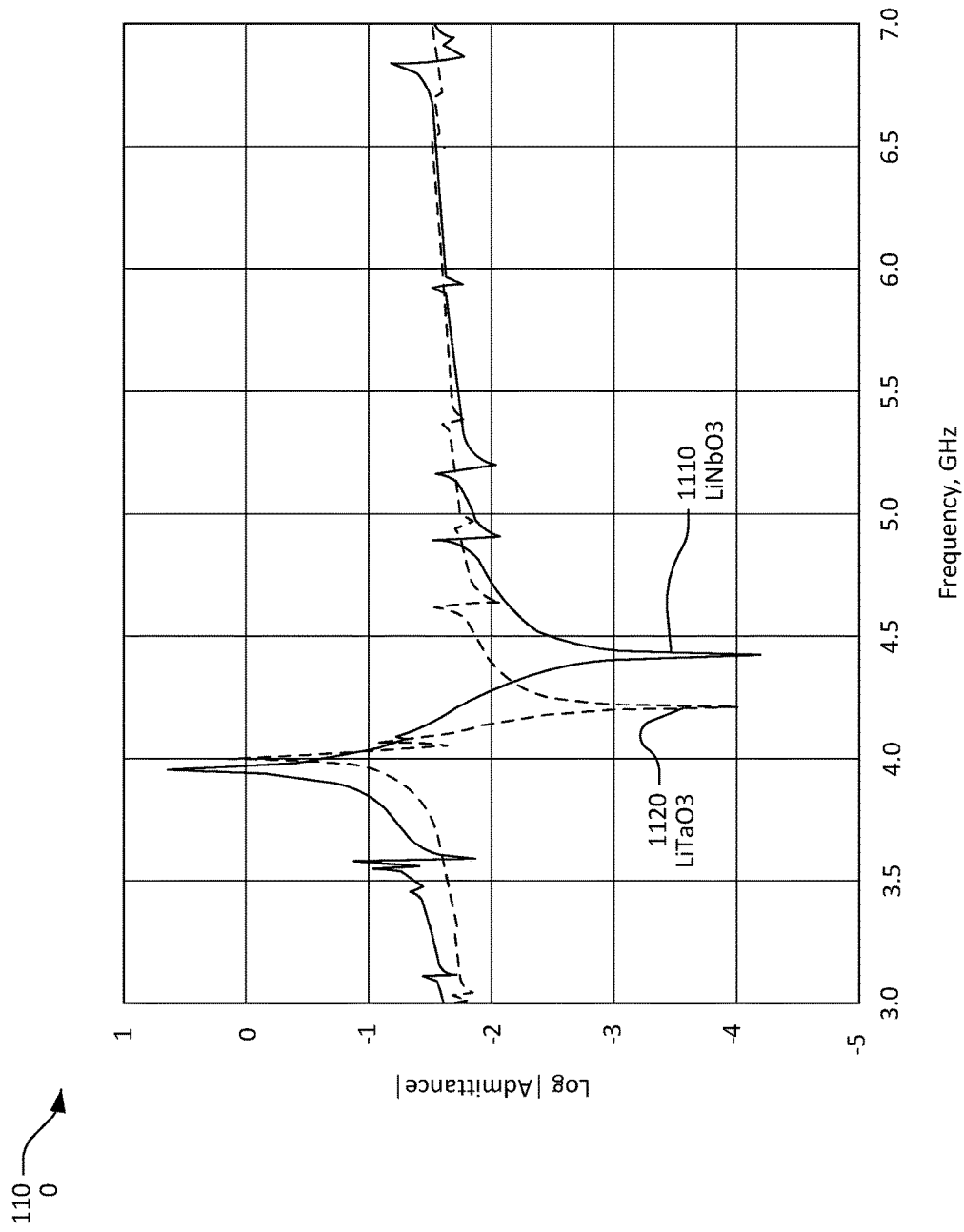
FIG. 11 is a chart comparing the admittances of XBARs on LiNbO3 and LiTaO3 plates.

FIG. 11 is a graph 1100 comparing the admittances, as functions of frequency, of two XBARs with different piezoelectric plate materials. The admittance data results from three-dimensional simulation of XBARs with the following parameter: ts=415 nm; tfd=120 nm; tbd=0; tm=460 nm; p=4.5 um; w=700 nm; AP=71 um; and N (total number of IDT fingers)=221. The substrate is Z-cut lithium niobite or Z-cut lithium tantalate, the IDT electrodes are copper, and the dielectric layer is SiO2.

The solid line 1110 is a plot of the admittance of an XBAR on a lithium niobate plate. The dashed line 1120 is a plot of the admittance of an XBAR on a lithium tantalate plate. Notably, the difference between the resonance and anti-resonance frequencies of the lithium tantalate XBAR is about 5%, or half of the frequency difference of the lithium niobate XBAR. The lower frequency difference of the lithium tantalate XBAR is due to the weaker piezoelectric coupling of the material. The measured temperature coefficient of the resonance frequency of a lithium niobate XBAR is about −71 parts-per-million per degree Celsius. The temperature coefficient of frequency (TCF) for lithium tantalate XBARs will be about half that of lithium niobate XBARs. Lithium tantalate XBARs may be used in applications that do not require the large filter bandwidth possible with lithium niobate XBARs and where the reduced TCF is advantageous.

Figure 12:
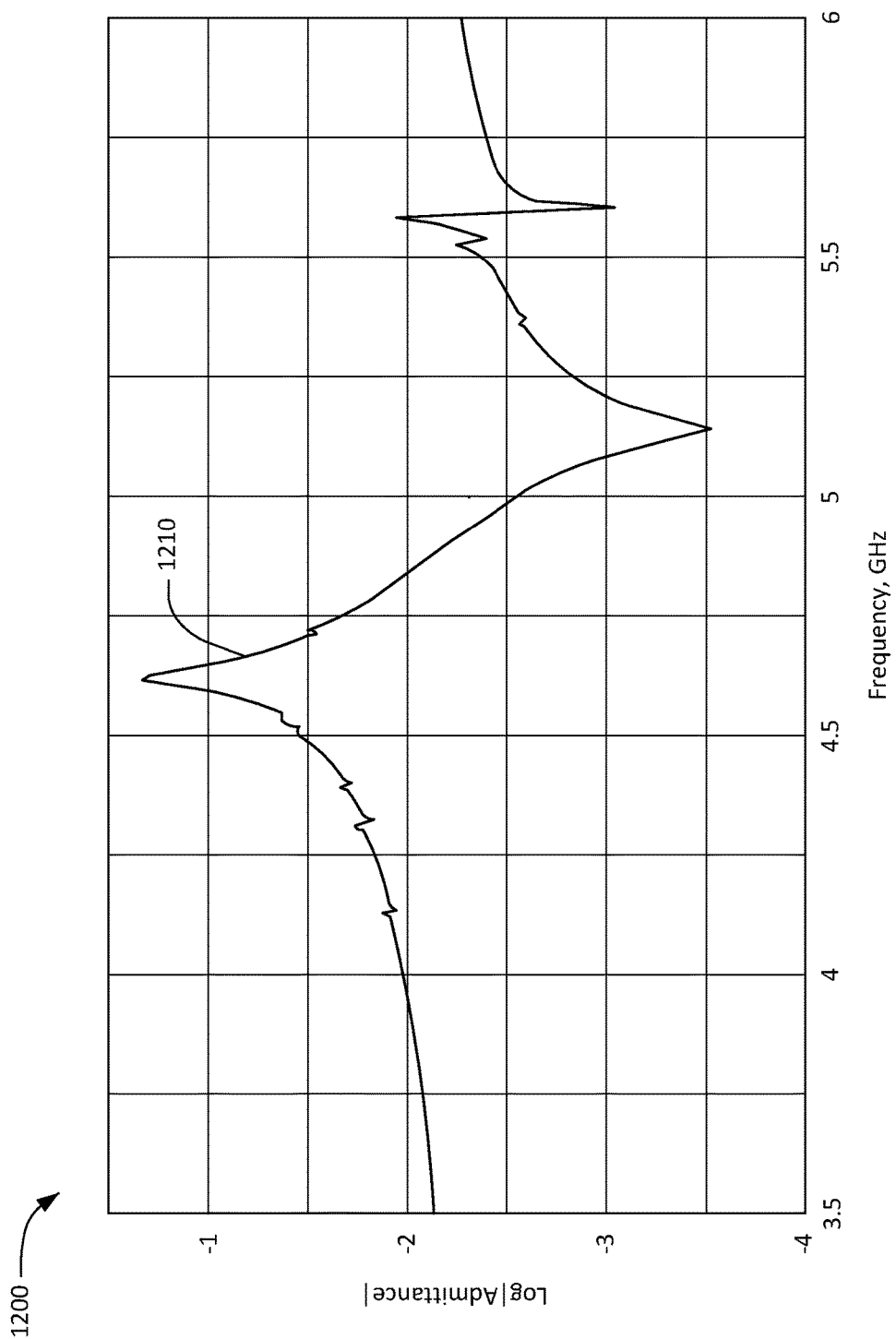
FIG. 12 is a chart of the measured admittance of an XBAR.

FIG. 12 is a chart showing the measured admittance of an experimental XBAR fabricated on a Z-cut lithium niobate plate with a thickness of 400 nm. The IDT had a pitch of 5 um, an aperture of 40 um, and 101 IDT fingers. The IDT fingers were aluminum with a thickness of 100 nm. The device did not include dielectric layers. The solid line 1210 is the magnitude of admittance as a function of frequency. The resonance frequency is 4617 MHz and the anti-resonance frequency is 5138 MHz. The frequency difference is 521 MHz or more than 11% of the resonance frequency. The measured data has not been corrected for the effects of the measurement system. Typically, correcting for the measurement system increases the anti-resonance frequency and the different between the anti-resonance and resonance frequencies.

Figure 13:
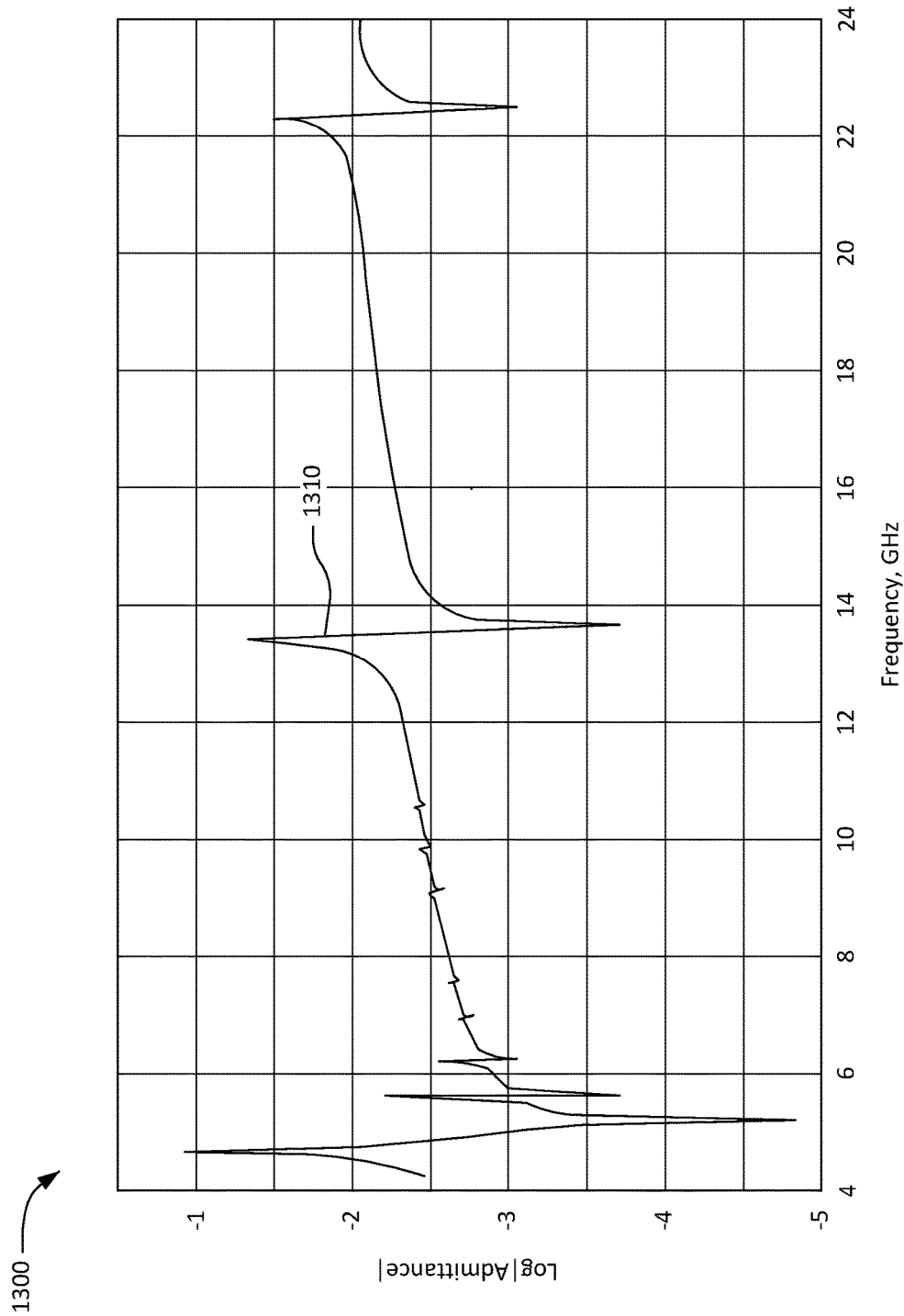
FIG. 13 is another chart of the measured admittance of an XBAR.

FIG. 13 is a chart showing the measured admittance of another experimental XBAR fabricated on a Z-cut lithium niobate plate with a thickness of 400 nm. The IDT had a pitch of 5 um, an aperture of 20 um, and 51 fingers. The IDT fingers were aluminum with a thickness of 100 nm. The device did not include dielectric layers. The solid line 1310 is the magnitude of admittance as a function of frequency. The third and fifth harmonics of the primary XBAR resonance are visible at about 13.5 GHz and 22.5 GHz, respectively. Resonances have been measured in other XBARs at frequencies as high as 60 GHz.

Figure 14:
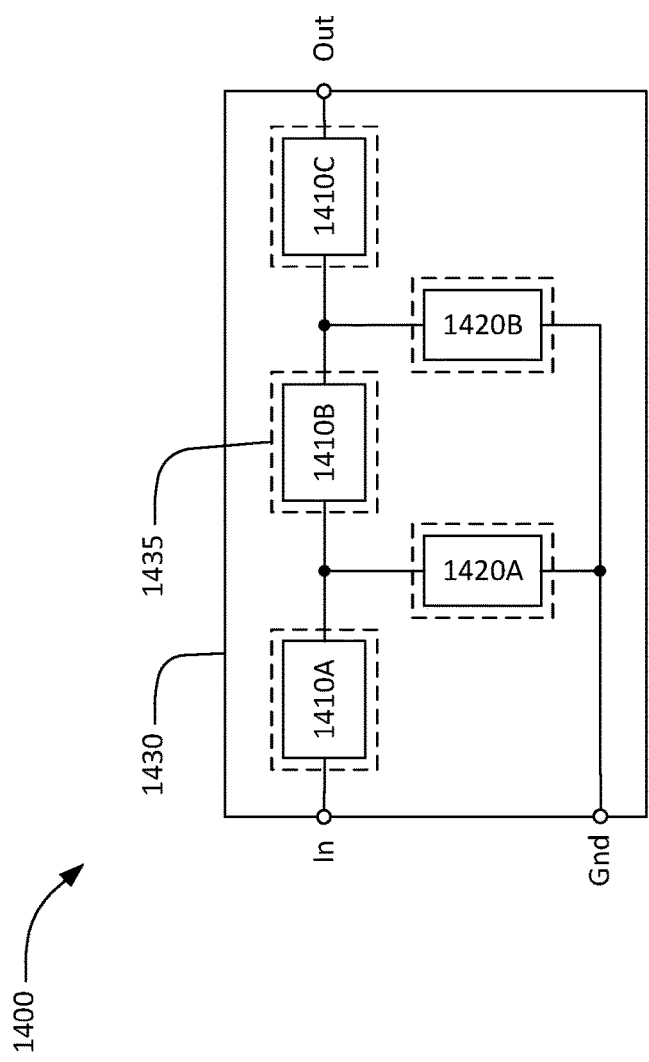
FIG. 14 is a schematic circuit diagram and layout of a filter using XBARs.

FIG. 14 is a schematic circuit diagram and layout for a high frequency band-pass filter 1400 using XBARs. The filter 1400 has a conventional ladder filter architecture including three series resonators 1410A, 1410B, 1410C and two shunt resonators 1420A, 1420B. The three series resonators 1410A, 1410B, and 1410C are connected in series between a first port and a second port. In FIG. 14, the first and second ports are labeled "In" and "Out", respectively. However, the filter 1400 is symmetrical and either port serve as the input or output of the filter. The two shunt resonators 1420A, 1420B are connected from nodes between the series resonators to ground. All the shunt resonators and series resonators are XBARs.

The three series resonators 1410A, B, C and the two shunt resonators 1420A, B of the filter 1400 are formed on a single plate 1430 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 14, the cavities are illustrated schematically as the dashed rectangles (such as the rectangle 1435). In this example, each IDT is disposed over a respective cavity. In other filters, the IDTs of two or more resonators may be disposed over a single cavity.

Figure 15:
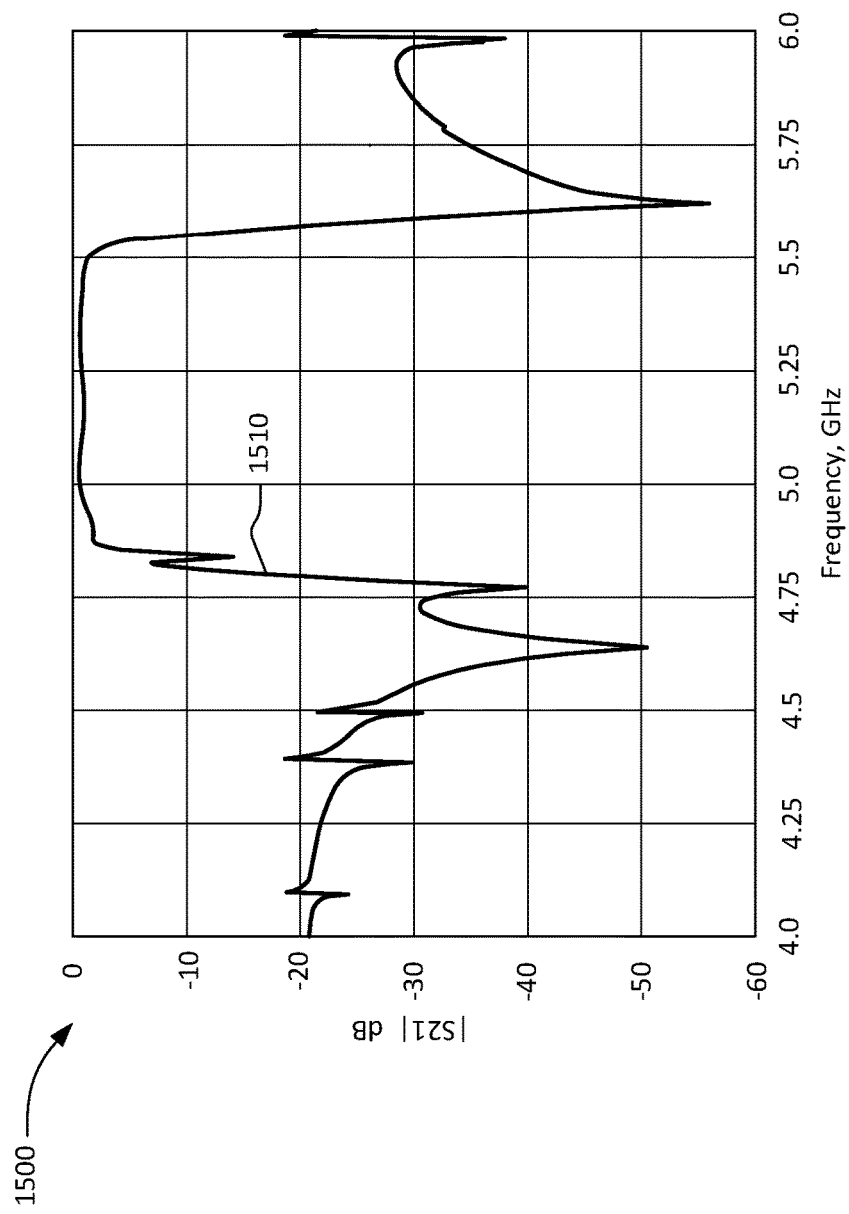
FIG. 15 is a graph of the transfer curve (S21) of an embodiment of the filter of FIG. 12.

FIG. 15 is a chart showing results from simulating a first bandpass filter incorporating five XBARs. The schematic diagram of the first filter is the same as the filter 1400 of FIG. 14. The XBARs are formed on a 0.4 micron thickness Z-cut lithium niobate plate. The substrate is silicon, the IDT conductors are aluminum, and there are no dielectric layers. The other physical parameters of the resonators are provided in the following table (all dimensions are in microns):

| Parameter | Series Resonators | | | Shunt Resonators | |
| --- | --- | --- | --- | --- | --- |
| | 1410A | 1410B | 1410C | 1420A | 1420B |
| p | 1.475 | 1.475 | 1.525 | 3.52 | 3.52 |
| w | 0.53 | 0.53 | 0.515 | 0.51 | 0.51 |
| AP | 12.8 | 8.6 | 13.8 | 33 | 40 |
| L | 250 | 250 | 250 | 500 | 500 |

The performance of the first filter was simulated using a 3D finite element modeling tool. The curve 1510 is a plot of the magnitude of S21, the input-output transfer function, of the first filter as a function of frequency. The filter bandwidth is about 800 MHz, centered at 5.15 GHz. The simulated filter performance includes resistive and viscous losses. Tuning of the resonant frequencies of the various resonators is accomplished by varying only the pitch and width of the IDT fingers.

Figure 16:
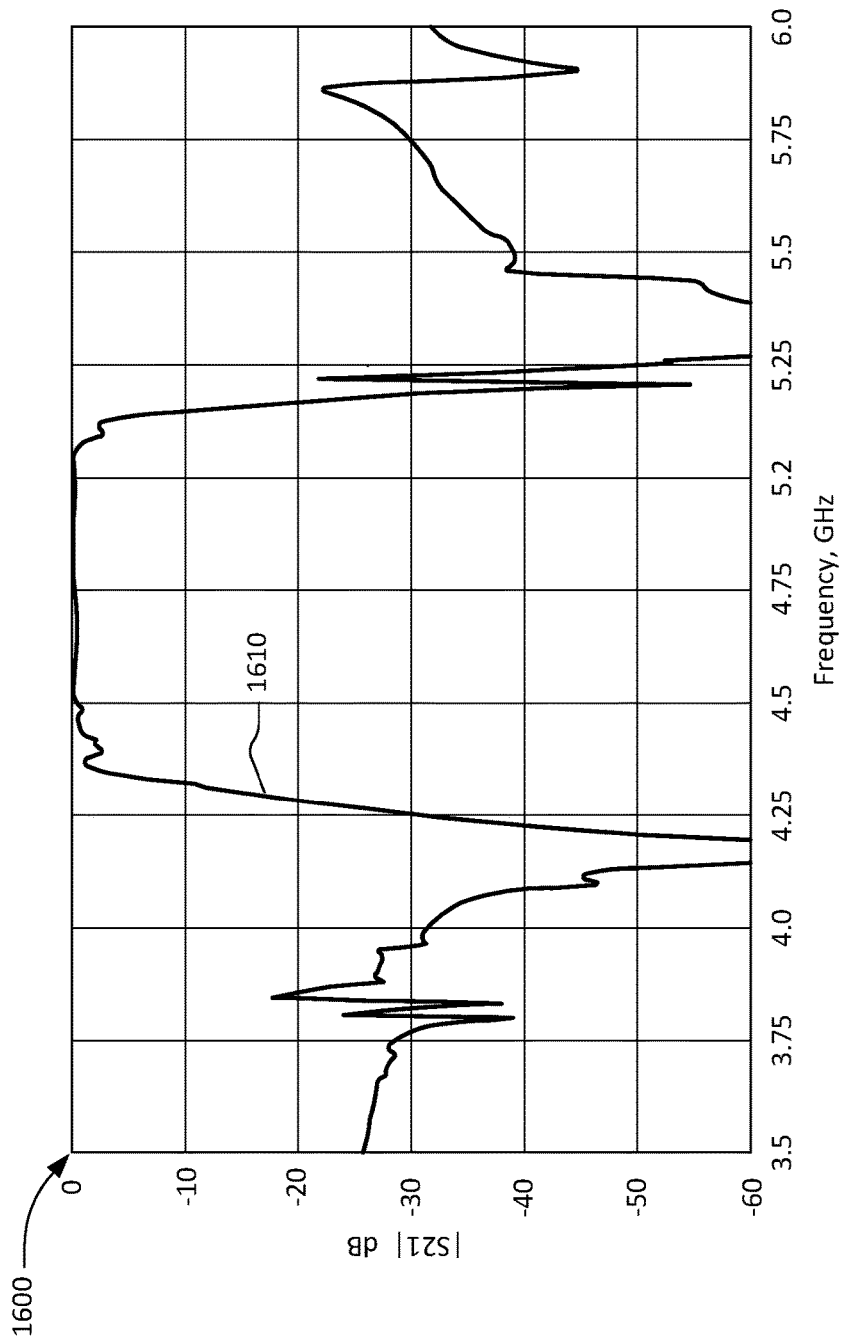
FIG. 16 is a graph of the transfer curve (S21) of another embodiment of the filter of FIG. 12.

FIG. 16 is a chart showing results from simulating a second filter using five XBARs. The schematic diagram of the second filter is the same as the filter 1400 of FIG. 14. The XBARs are formed on a Z-cut lithium niobate (0.4 um thick) piezoelectric plate. The substrate is silicon, and the IDT electrodes are copper. Adjusting the resonant frequencies of the resonators is accomplished by varying the pitch and width of the IDT fingers and by providing a front-side dielectric layer on the shunt resonators to reduce their frequencies. The other physical parameters of the resonators are provided in the following table (all dimensions are in microns):

| Parameter | Series Resonators | | | Shunt Resonators | |
| --- | --- | --- | --- | --- | --- |
| | 1410A | 1410B | 1410C | 1420A | 1420B |
| p | 4.189 | 4.07 | 4.189 | 4.2 | 4.2 |
| w | 0.494 | 0.505 | 0.494 | 0.6 | 0.6 |
| AP | 46.4 | 23.6 | 46.4 | 80.1 | 80.1 |
| L | 1000 | 1000 | 1000 | 1000 | 1000 |
| tfd | 0 | 0 | 0 | 0.106 | 0.106 |

The performance of the filter was simulated using a 3D finite element modeling tool. The curve 1610 is a plot of S21, the input-output transfer function, of the simulated filter 1400 as a function of frequency. The filter bandwidth is about 800 MHz, centered at 4.75 GHz. The simulated performance does not include resistive or viscous losses.

The first and second filters (whose S21 transmission functions are shown in FIG. 15 and FIG. 16) are examples of filters using XBARs. A filter may use more or fewer than two shut resonators, more or fewer than three series resonators, and more or fewer than five total resonators. A filter may use reactive components, such as capacitors, inductors, and delay lines in addition to XBARs. Further fine tuning of the individual resonators of these filters may improve filter performance.

Description of Methods

Figure 17:
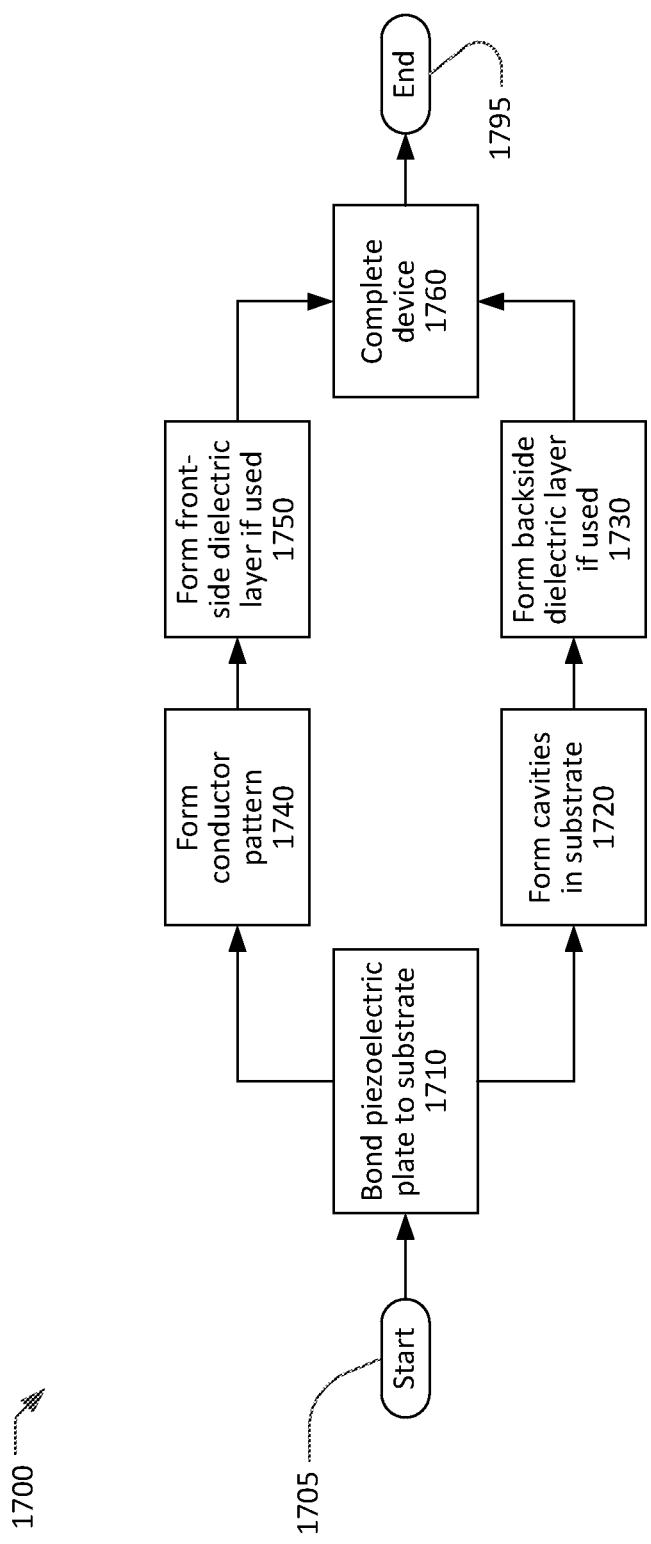
FIG. 17 is a flow chart of a process for fabricating an XBAR.

FIG. 17 is a simplified flow chart of a method 1700 for making an XBAR or a filter incorporating XBARs. The method 1700 starts at 1705 with a substrate and a plate of piezoelectric material and ends at 1795 with a completed XBAR or filter. The flow chart of FIG. 17 includes only major process steps. Various conventional process steps (e.g. surface preparation, cleaning, inspection, baking, annealing, monitoring, testing, etc.) may be performed before, between, after, and during the steps shown in FIG. 17.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

At 1710, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A variation of the process 1700 is to grow the piezoelectric plate in situ on the substrate. In that process variation, bonding is not required and the action at 1710 would be redefined as "grow piezoelectric plate on substrate."

At 1720, one or more cavities are formed in the substrate. A separate cavity may be formed for each resonator in a filter device. The one or more cavities may be formed using an anisotropic or orientation-dependent dry or wet etch to open holes from the back side of the substrate to the piezoelectric plate. Alternatively, cavities in the form of recesses in the substrate may be formed by etching the substrate using an etchant introduced through openings in the piezoelectric plate.

A variation of the process 1700 is to form the one or more cavities in the substrate prior to attaching the piezoelectric plate to the substrate. In that process variation, the actions at 1720 and 1730 occur before the action at 1710.

At 1730, a back-side dielectric layer may be formed. In the case where the cavities formed at 1720 are holes through the substrate, the back-side dielectric layer may be deposited through the cavities using a convention deposition technique such as sputtering, evaporation, or chemical vapor deposition. When the cavities formed at 1720 are recesses that do not fully penetrate the substrate, the back-side dielectric layer must be formed on the piezoelectric plate or the substrate prior to bonding the piezoelectric plate to the substrate. In that case, the actions at 1730 occur before the actions at 1710.

A conductor pattern, including IDTs of each XBAR, is formed at 1740 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1740 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1740 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1750, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

After the front-side and back-side dielectric layers are formed at 1750 and 1730, the filter device may be completed at 1760. Actions that may occur at 1760 including depositing and patterning additional metal layers to form conductors other than the IDT conductor pattern; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1760 is to tune the resonant frequencies of the resonators within the device by adding or removing metal or dielectric material from the front side of the device. After the filter device is completed, the process ends at 1795.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device, comprising:
    a substrate;
    a piezoelectric plate having parallel front and back surfaces, the back surface attached to the substrate; and
    a conductor pattern formed on the front surface, the conductor pattern including a plurality of interdigital transducers (IDTs) of a respective plurality of resonators, wherein
    interleaved fingers of each of the plurality of IDTs are disposed on respective portions of the piezoelectric plate suspended over one or more cavities formed in the substrate,
    the plurality of resonators includes a shunt resonator and a series resonator,
    a first thickness of a first dielectric layer deposited between the fingers of the IDT of the shunt resonator is greater than a second thickness of a second dielectric layer deposited between the fingers of the IDT of the series resonator,
    a resonance frequency of the shunt resonator is set, at least in part, by the first thickness,
    a resonance frequency of the series resonator is set, at least in part, by the second thickness, and
    a difference between the first thickness and the second thickness is sufficient to set the resonance frequency of the shunt resonator at least 140 MHz lower than the resonance frequency of the series resonator.

2. The filter device of claim 1, wherein all of the plurality of IDTs are configured to excite shear acoustic waves in the piezoelectric plate in response to respective radio frequency signals applied to each IDT.

3. The device of claim 1, wherein a thickness between the front and back surfaces of the piezoelectric plate is greater than or equal to 200 nm and less than or equal to 1000 nm.

4. The filter device of claim 1, wherein the one or more cavities formed in the substrate are respective cavities for each of the plurality of IDTs.

5. The filter device of claim 1, wherein each of the plurality of IDTs has a respective pitch greater than or equal to 2 times the thickness of the piezoelectric plate and less than or equal to 25 times the thickness of the piezoelectric plate.

6. The filter device of claim 1, wherein
the plurality of resonators includes two or more shunt resonators, and
the first dielectric layer is disposed on the front surface between the fingers of all of the two or more shunt resonators.

7. The filter device of claim 1, wherein
the plurality of resonators includes two or more series resonators, and
the second dielectric layer is disposed on the front surface between the fingers of all of the two or more series resonators.

8. The filter device of claim 1, wherein
a z-axis of the piezoelectric plate is normal to the front and back surfaces.

9. The filter device of claim 8, wherein
all of the plurality of IDTs are oriented such that the fingers of the IDTs are parallel to an x-axis of the piezoelectric plate.

10. A filter device, comprising:
a substrate;
a piezoelectric plate having parallel front and back surfaces, the back surface attached to the substrate;
a conductor pattern formed on the front surface, the conductor pattern including a plurality of interdigital transducers (IDTs) of a respective plurality of resonators including a shunt resonator and a series resonator;
a first dielectric layer having a first thickness deposited over the IDT of the shunt resonator; and
a second dielectric layer having a second thickness deposited over the IDT of the series resonator, wherein
interleaved fingers of each of the plurality of IDTs are disposed on respective portions of the piezoelectric plate suspended over one or more cavities formed in the substrate,
a resonance frequency of the shunt resonator is set, at least in part, by the first thickness,
a resonance frequency of the series resonator is set, at least in part, by the second thickness, and
a difference between the first thickness and the second thickness is sufficient to set the resonance frequency of the shunt resonator at least 140 MHz lower than the resonance frequency of the series resonator.

11. The filter device of claim 10, wherein all of the plurality of IDTs are configured to excite shear acoustic waves in the piezoelectric plate in response to respective radio frequency signals applied to each IDT.

12. The device of claim 10, wherein a thickness between the front and back surfaces of the piezoelectric plate is greater than or equal to 200 nm and less than or equal to 1000 nm.

13. The filter device of claim 10, wherein the one or more cavities formed in the substrate are respective cavities for each of the plurality of IDTs.

14. The filter device of claim 10, wherein each of the plurality of IDTs has a respective pitch greater than or equal to 2 times the thickness of the piezoelectric plate and less than or equal to 25 times the thickness of the piezoelectric plate.

15. The filter device of claim 10, wherein
the plurality of resonators includes two or more shunt resonators, and
the first dielectric layer is disposed on the front surface over all of the two or more shunt resonators.

16. The filter device of claim 10, wherein
the plurality of resonators includes two or more series resonators, and
the second dielectric layer is disposed on the front surface over all of the two or more series resonators.

17. The filter device of claim 10, wherein
a z-axis of the piezoelectric plate is normal to the front and back surfaces.

18. The filter device of claim 17, wherein
all of the plurality of IDTs are oriented such that the fingers of the IDTs are parallel to an x-axis of the piezoelectric plate.

19. A filter device, comprising:
a substrate;
a piezoelectric plate having parallel front and back surfaces, the back surface attached to the substrate; and
a conductor pattern formed on the front surface, the conductor pattern including a plurality of interdigital transducers (IDTs) of a respective plurality of resonators, wherein
interleaved fingers of each of the plurality of IDTs are disposed on respective portions of the piezoelectric plate suspended over one or more cavities formed in the substrate,
the plurality of resonators includes a shunt resonator and a series resonator, and
a first thickness of a first dielectric layer deposited between the fingers of the IDT of the shunt resonator is greater than a second thickness of a second dielectric layer deposited between the fingers of the IDT of the series resonator,
the first and second dielectric layers are $SiO_2$, and
a difference between the first thickness and the second thickness is greater than or equal to 30 nm.

20. The filter device of claim 19, wherein all of the plurality of IDTs are configured to excite shear acoustic waves in the piezoelectric plate in response to respective radio frequency signals applied to each IDT.

21. The device of claim 19, wherein a thickness between the front and back surfaces of the piezoelectric plate is greater than or equal to 200 nm and less than or equal to 1000 nm.

22. The filter device of claim 19, wherein the one or more cavities formed in the substrate are respective cavities for each of the plurality of IDTs.

23. The filter device of claim 19, wherein each of the plurality of IDTs has a respective pitch greater than or equal to 2 times the thickness of the piezoelectric plate and less than or equal to 25 times the thickness of the piezoelectric plate.

24. The filter device of claim 19, wherein
the plurality of resonators includes two or more shunt resonators, and
the first dielectric layer is disposed on the front surface between the fingers of all of the two or more shunt resonators.

25. The filter device of claim 19, wherein
the plurality of resonators includes two or more series resonators, and
the second dielectric layer is disposed on the front surface between the fingers of all of the two or more series resonators.

26. The filter device of claim 19, wherein
a z-axis of the piezoelectric plate is normal to the front and back surfaces.

27. The filter device of claim 26, wherein
all of the plurality of IDTs are oriented such that the fingers of the IDTs are parallel to an x-axis of the piezoelectric plate.

28. A filter device, comprising:
a substrate;
a piezoelectric plate having parallel front and back surfaces, the back surface attached to the substrate;
a conductor pattern formed on the front surface, the conductor pattern including a plurality of interdigital transducers (IDTs) of a respective plurality of resonators including a shunt resonator and a series resonator;
a first dielectric layer having a first thickness deposited over the IDT of the shunt resonator; and
a second dielectric layer having a second thickness less than the first thickness deposited over the IDT of the series resonator, wherein
interleaved fingers of each of the plurality of IDTs are disposed on respective portions of the piezoelectric plate suspended over one or more cavities formed in the substrate,
the first and second dielectric layers are at least one of SiO2 and Si3N4, and
a difference between the first thickness and the second thickness is greater than or equal to 30 nm.

29. The filter device of claim 28, wherein all of the plurality of IDTs are configured to excite shear acoustic waves in the piezoelectric plate in response to respective radio frequency signals applied to each IDT.

30. The device of claim 28, wherein a thickness between the front and back surfaces of the piezoelectric plate is greater than or equal to 200 nm and less than or equal to 1000 nm.

31. The filter device of claim 28, wherein the one or more cavities formed in the substrate are respective cavities for each of the plurality of IDTs.

32. The filter device of claim 28, wherein each of the plurality of IDTs has a respective pitch greater than or equal to 2 times the thickness of the piezoelectric plate and less than or equal to 25 times the thickness of the piezoelectric plate.

33. The filter device of claim 28, wherein
the plurality of resonators includes two or more shunt resonators, and
the first dielectric layer is disposed on the front surface over all of the two or more shunt resonators.

34. The filter device of claim 28, wherein
the plurality of resonators includes two or more series resonators, and
the second dielectric layer is disposed on the front surface over all of the two or more series resonators.

35. The filter device of claim 28, wherein
a z-axis of the piezoelectric plate is normal to the front and back surfaces.

36. The filter device of claim 35, wherein
all of the plurality of IDTs are oriented such that the fingers of the IDTs are parallel to an x-axis of the piezoelectric plate.

* * * * *